United States Patent
He et al.

(10) Patent No.: US 10,636,358 B2
(45) Date of Patent: Apr. 28, 2020

(54) METHOD FOR IMPROVING DISPLAY EFFECT OF DISPLAY PANEL AND DISPLAY PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Jian He, Guangdong (CN); Ming-jong Jou, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/744,753

(22) PCT Filed: Oct. 21, 2017

(86) PCT No.: PCT/CN2017/107181
§ 371 (c)(1),
(2) Date: Sep. 29, 2018

(87) PCT Pub. No.: WO2019/056448
PCT Pub. Date: Mar. 28, 2019

(65) Prior Publication Data
US 2019/0088203 A1    Mar. 21, 2019

(30) Foreign Application Priority Data
Sep. 20, 2017   (CN) .......................... 2017 1 0856090

(51) Int. Cl.
*G09G 3/3258* (2016.01)
*G09G 3/20* (2006.01)
(Continued)

(52) U.S. Cl.
CPC ......... *G09G 3/3258* (2013.01); *G09G 3/2074* (2013.01); *G09G 3/3233* (2013.01);
(Continued)

(58) Field of Classification Search
CPC .................................................... G09G 3/3258
See application file for complete search history.

(56) References Cited

U.S. PATENT DOCUMENTS

2014/0354698 A1* 12/2014 Lee ...................... G09G 3/3258
345/690
2015/0097872 A1* 4/2015 Jeong ................... G09G 3/3225
345/690
(Continued)

FOREIGN PATENT DOCUMENTS

CN    103854616 A    6/2014
CN    104599637 A    5/2015
(Continued)

*Primary Examiner* — Long D Pham
(74) *Attorney, Agent, or Firm* — Hemisphere Law, PLLC; Zhigang Ma

(57) ABSTRACT

A method for improving display panel display effect and a display panel are disclosed, the method includes: pre-acquiring an external compensation lookup table corresponding to each pixel grayscale 255 in the display panel; introducing the external compensation lookup table to the storage unit and replacing the data corresponding to an original grayscale 255 in the preset voltage table; driving the PWM driving circuit according to a replaced data. It combines the external compensation method to improve the display effect of the PWM digital drive and avoids the problem that the PWM circuit cannot eliminate the unevenness of the display panel in the grayscale 255 and enhance the actual display effect of the display panel.

20 Claims, 4 Drawing Sheets

(51) Int. Cl.
*G09G 3/3233* (2016.01)
*H01L 27/32* (2006.01)

(52) U.S. Cl.
CPC ............ *G09G 2300/0819* (2013.01); *G09G 2310/0262* (2013.01); *G09G 2310/0264* (2013.01); *G09G 2320/0233* (2013.01); *G09G 2320/045* (2013.01); *H01L 27/3213* (2013.01)

(56) References Cited

U.S. PATENT DOCUMENTS

2016/0321980 A1* 11/2016 Matsumoto .......... G09G 3/2025
2018/0102088 A1 4/2018 Deng

FOREIGN PATENT DOCUMENTS

| CN | 105529011 A | 4/2016 |
| CN | 106297699 A | 1/2017 |
| CN | 106782307 A | 5/2017 |
| CN | 106898327 A | 6/2017 |
| JP | 2009058684 A | 3/2009 |

* cited by examiner

METHOD FOR IMPROVING DISPLAY EFFECT OF DISPLAY PANEL AND DISPLAY PANEL

RELATED APPLICATIONS

The present application is a National Phase of International Application Number PCT/CN2017/107181, filed Oct. 21, 2017, and claims the priority of China Application CN 201710856090.8, filed Sep. 20, 2017.

FIELD OF THE DISCLOSURE

The present disclosure relates to a liquid crystal display technology field, and more particularly to a method for improving display effect of the display panel, and to a display panel.

BACKGROUND OF THE DISCLOSURE

Because of high quality, energy saving, thin body and wide application of the advantages, OLED liquid crystal display device is widely used in mobile phones, personal digital assistants, digital cameras, laptops, desktop computers, television and other consumer electronics products, playing the mainstream of the display device.

As shown in FIG. 1, which is a common pixel driving circuit to OLEDs. Due to the transistor T2 operating in a long period of time, the threshold voltage Vth drifts in the saturation region, and resulting in a luminance unevenness (mura) for the panel display screen. To improve the brightness unevenness, the PWM (digital drive) mode is presented. Sub-field cutting method is the commonly used PWM drive mode. The simplest structure is 3T1C pixel circuit, as shown in FIG. 2, Data is the data drive signal, Gate1 is the charging scan signal, the control transistor T1 charges the point A, Gate2 is the discharge scan signal, the control transistor T3 discharges the point A, Vini is the reference voltage, which is around zero. A outputs only two Gamma voltages, namely GM1 (brightest) and GM9 (darkest) two voltage levels. According to the transistor current voltage I-V equation:

$$Ids,sat = k^*(Vgs-Vth,T2)^2 = k^*(VA-VB-Vth,T2)^2$$

Among them, Ids,sat is the transistor conduction current, k is the intrinsic conductivity factor, Vgs is the transistor gate voltage, Vth, T2 is the threshold voltage of the transistor T2, VA is the voltage of point A. VB is the voltage of point B. Due to the degradation or non-uniformity of the device, the variation ΔVth of the transistor Vth changes little relative to (VA−VB). Therefore, relative to the analog voltage drive mode, PWM drive can inhibit the OLED brightness uneven problem.

However, when the image is grayscale 255, the mura of the panel has been very serious, PWM driving method cannot eliminate the mura under grayscale 255, resulting in the actual display of the LCD panel is not ideal. As shown in FIG. 3, FIG. 3 shows a 8 bits sub-field and other cut PWM drive diagram. The x-axis represents time, and the y-axis represents scanning time of the scan line. A frame is cut into 8 sub-fields with the same time, by controlling the charge and discharge time period of PWM driving circuit to achieve the pixels has different lighting time in different sub-fields, the pixel lighting time duty ratio is 1/128, 1/64, 1/32, 1/16, 1/8, 1/4, 1/2, 1, so that the grayscale of the display panel is different. When the grayscale is 255, the panel brightness uneven phenomenon has been very serious, and PWM driving circuit sub-field cutting drive method cannot eliminate the panel 255 grayscale brightness uneven phenomenon, grayscale 255 pixels show the brightness of the uneven phenomenon will directly affect the display effect to other grayscale pixels, resulting in the actual display effect of the display panel is not ideal.

SUMMARY OF THE DISCLOSURE

The technical problem that the present disclosure mainly solves is to provide a method and a display panel which can improve the display panel display, and can solve the problem that the PWM driving circuit cannot eliminate the unevenness of the display panel in the grayscale 255.

In order to solve the above-mentioned technical problems, a technical aspect of the present disclosure is to provide a method for improving the display effect of a display panel, the display panel includes a PWM driving circuit and a storage unit, the storage unit storing a preset voltage table corresponding to a different grayscale of the PWM driving circuit, wherein the method includes: driving the PWM driving circuit according to the preset voltage table; acquiring a corresponding voltage at the grayscale 255 from the preset voltage table stored by the storage unit; external compensating a display image of the grayscale 255 to respectively acquire the external compensation lookup table of the grayscale 255 in different sub-pixels; introducing the external compensation lookup table into the storage unit and replacing the data corresponding to the original grayscale 255 in the preset voltage table; and acquiring the corresponding voltage from the external compensation lookup table and controlling the corresponding driving voltage outputted from the PWM driving circuit, when the pixel value is grayscale 255.

In order to solve the above-mentioned technical problems, another aspect of the present disclosure is to provide a method for improving the display effect of a display panel, the display panel includes a PWM driving circuit and a storage unit, the storage unit storing a preset voltage table corresponding to a different grayscale of the PWM driving circuit, wherein the method includes: pre-acquiring an external compensation lookup table corresponding to each pixel grayscale 255 in the display panel; introducing the external compensation lookup table into the storage unit and replacing the data corresponding to the original grayscale 255 in the preset voltage table; and driving the PWM driving circuit according to the replaced data.

In order to solve the above-mentioned technical problems, a technical aspect of the present disclosure is to provide a method for improving the display effect of a display panel, the display panel includes a PWM driving circuit and a storage unit, the storage unit storing a preset voltage table corresponding to a different grayscale of the PWM driving circuit, wherein the method includes: driving the PWM driving circuit according to the preset voltage table; acquiring a corresponding voltage at the grayscale 255 from the preset voltage table stored by the storage unit; external compensating a display image of the grayscale 255 to respectively acquire the external compensation lookup table of the grayscale 255 in the different sub-pixel; introducing the external compensation lookup table to the storage unit and replacing the data corresponding to the original grayscale 255 in the preset voltage table; and acquiring the corresponding voltage from the external compensation lookup table and controlling the corresponding driving voltage outputted from the PWM driving circuit, when the pixel value is grayscale 255.

An advantageous effect of the present disclosure is that, in contrast to the prior art, the present disclosure proposes a grayscale compensation method. The PWM driving circuit grayscale 255 dark state voltage is fixed, for the grayscale 0 corresponding to the voltage value, and the bright state voltage is not fixed by the panel grayscale 255 by external compensation generated lookup table to determine, the PWM circuit outputs the bright state voltage corresponding to the grayscale 255 according to the external compensation lookup table. The disclosure combines the external compensation method to improve the display effect of the PWM digital drive and avoids the problem that the PWM circuit cannot eliminate the unevenness of the display panel in the grayscale 255 and enhance the actual display effect of the display panel.

DETAILED DESCRIPTION OF PREFERRED EMBODIMENTS

The embodiments described in the embodiments of the present disclosure will now be described in conjunction with the accompanying drawings in the embodiments of the present disclosure, and it will be apparent that the described embodiments are merely part of the embodiments of the disclosure and are not intended to be exhaustive. All other embodiments acquired by those of ordinary skill in the art without making creative work are within the scope of the present disclosure, based on embodiments in the present disclosure.

Figure 1:
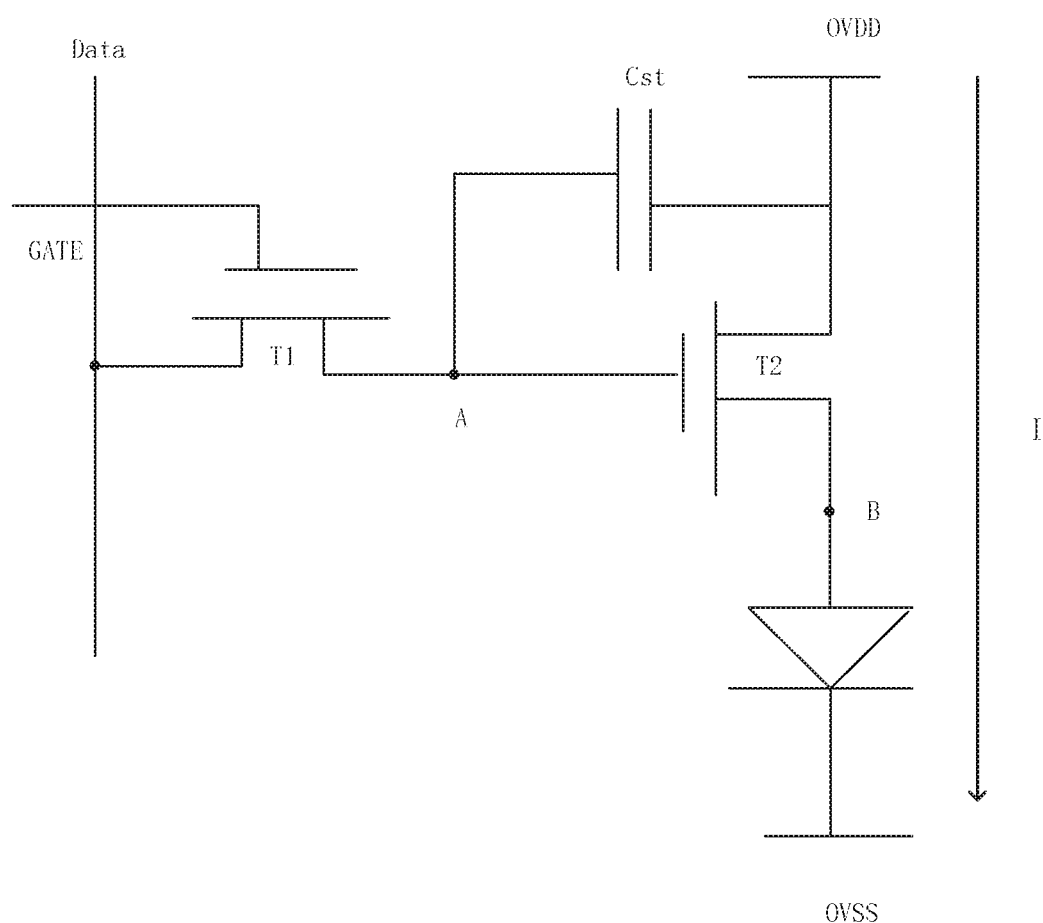
FIG. 1 is an existing OLED pixel drive circuit diagram.
Figure 2:
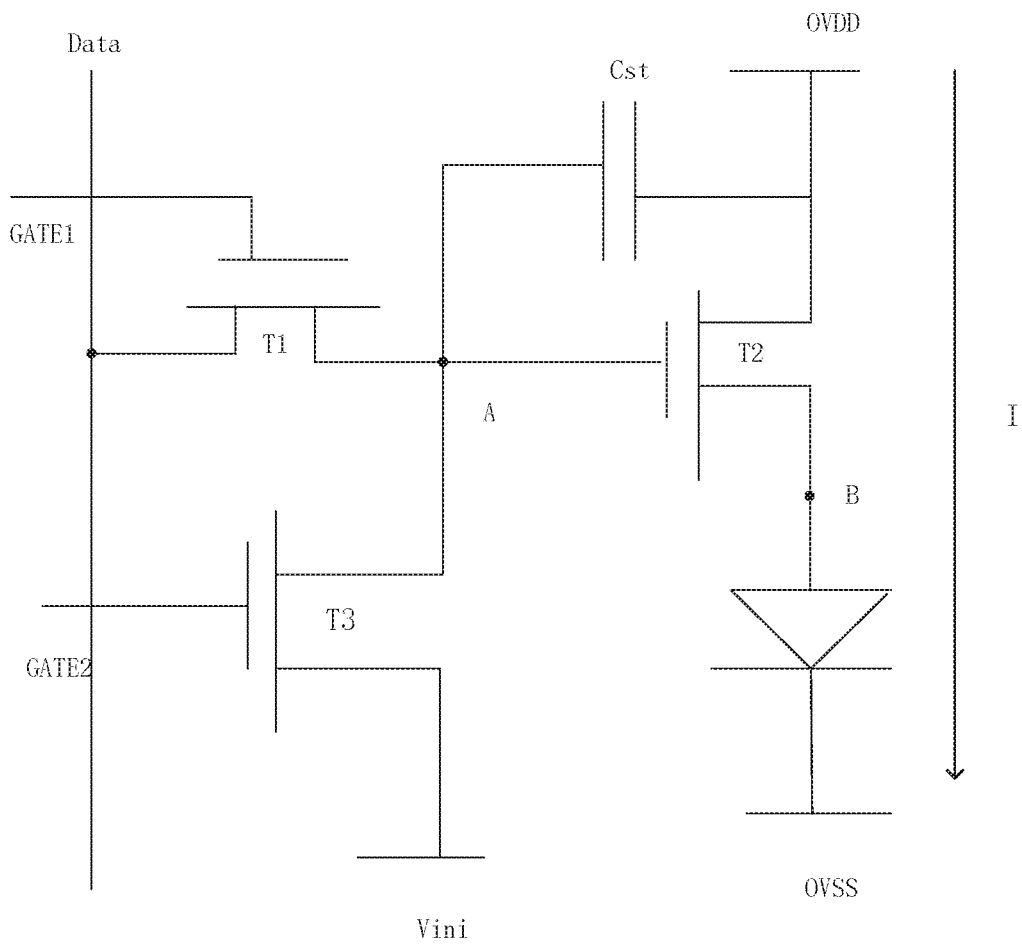
FIG. 2 is a conventional PWM driving circuit diagram.
Figure 3:
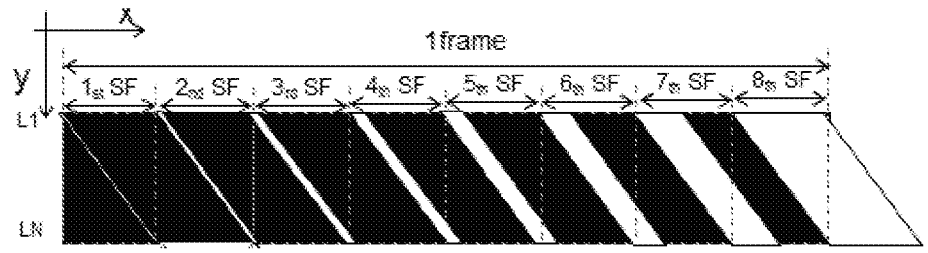
FIG. 3 is the current 8 bits sub-field cut off the PWM drive diagram.
Figure 4:
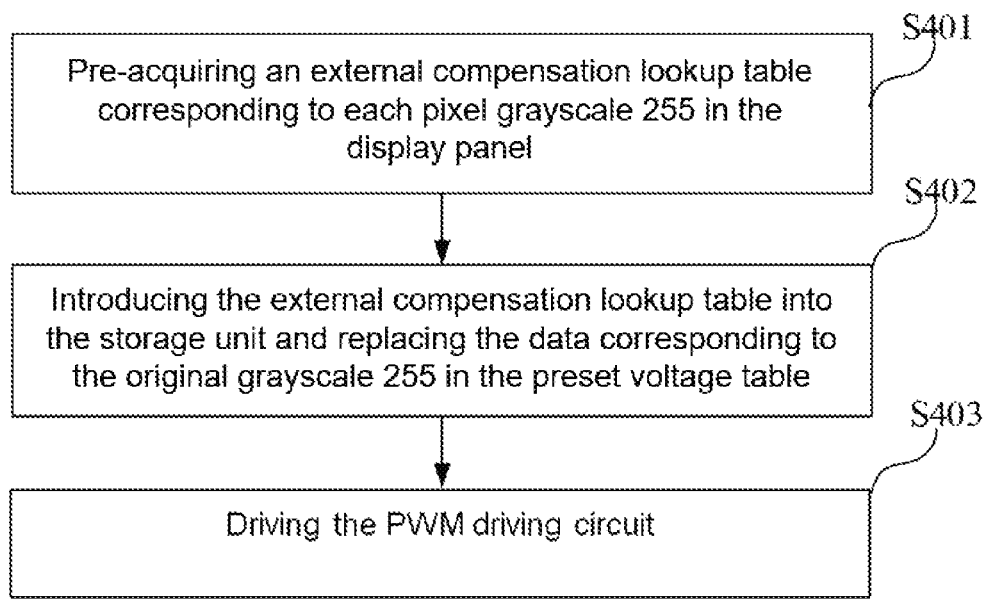
FIG. 4 is a flow chart of an embodiment of the present disclosure for improving the display effect of a display panel.

Please refer to FIG. 4, FIG. 4 is a flow chart of an embodiment of the present disclosure for improving the display effect of a display panel. The method for improving the display effect of the display panel of the present embodiment includes the steps of:

S401: pre-acquiring an external compensation lookup table corresponding to each pixel grayscale 255 in the display panel.

In a specific embodiment, the display panel of the present disclosure is an OLED display panel. The OLED display panel includes a PWM driving circuit and a storage unit, and the storage unit stores a preset voltage table corresponding to a different grayscale by the PWM driving circuit.

As already mentioned, when the image is grayscale 255, the mura of the panel has been very serious, PWM drive cannot eliminate the mura under the grayscale 255, resulting in the actual display of the LCD panel is not ideal. In order to eliminate the luminance unevenness in the grayscale 255 of the panel, the present embodiment pre-acquires the external compensation lookup table corresponding to each pixel grayscale 255 in the display panel.

In a specific embodiment, the external compensation lookup table corresponding to each pixel grayscale 255 in the display panel is acquired in advance by the following method.

The PWM driving circuit acquiring the corresponding driving voltage when the same sub-pixel of the pixel in grayscale 255 from the preset voltage table stored by the storage unit. Wherein the preset voltage table stores the corresponding bright state voltage and the dark state voltage when each sub-pixel are different grayscale values. The driving voltage when each sub-pixel are different grayscale values is the difference between the bright state voltage in the PWM driving circuit minus the dark state voltage. Wherein the dark state voltage is the corresponding voltage in grayscale 0, the bright state voltage can be acquired from the preset voltage table. The PWM driving circuit outputting the driving voltage corresponding to the sub-pixel to the grayscale 255 to each pixel, and the display panel displaying the screen. Acquiring the grayscale value of each sub-pixel on the screen and external compensating the sub-pixel on the screen. Compensating the driving voltage of the pixel according to the actual voltage of each pixel, so that the grayscale value of the sub-pixel is 255, and acquiring the grayscale 255 external compensation lookup table in the sub-pixel.

In the above embodiment, the sub-pixel of the pixel on the display panel is RGB three sub-pixels or RGBW four sub-pixels.

In the above-described embodiment, the PWM driving circuit repeats the step S401 so that all the sub-pixels of the pixel are grayscale 255, and the grayscale 255 external compensation lookup table under the different sub-pixels of each pixel is acquired.

S402: introducing the external compensation lookup table into the storage unit and replacing the data corresponding to the original grayscale 255 in the preset voltage table.

In a specific embodiment, the external compensation lookup table for storing the compensation driving voltage when each sub-pixel is grayscale 255 is introduced into the storage unit, and the data corresponding to the original grayscale 255 in the preset voltage table is replaced with the external compensation lookup table.

In the above-described embodiment, the storage unit may be a memory chip, a hard disk, or a removable hard disk or a USB device, an optical disk, or the like, and may be a server or the like.

S403: driving the PWM driving circuit.

In a specific embodiment, the PWM driving circuit acquires the data of each pixel, the drive circuit derives the grayscale values of sub-pixels from the data and divides them into grayscale values 0 to 254 and 255.

When the acquired pixel value is grayscale 0 to 254, the PWM driving circuit acquires the corresponding voltage from the preset voltage table stored in the storage unit according to the sub-pixel and the actual grayscale value in the pixel value.

The PWM driving circuit outputs the driving voltage corresponding to the actual grayscale value of the sub-pixel to each pixel, and the sub-pixels of each pixel display the corresponding grayscale.

When the acquired pixel value is grayscale 255, the PWM driving circuit acquires the corresponding driving voltage from the external compensation lookup table stored in the storage unit according to the pixel of the sub-pixel subordinate in the pixel value.

The PWM driving circuit outputs the corresponding drive voltage, and the sub-pixels of each pixel are grayscale 255.

An advantageous effect of the present disclosure is that, in contrast to the prior art, the present disclosure proposes a grayscale compensation method. The PWM driving circuit grayscale 255 dark state voltage is fixed, for the grayscale 0 corresponding to the voltage value, and the bright state voltage is not fixed by the panel grayscale 255 by external compensation generated lookup table to determine, the PWM circuit outputs the bright state voltage corresponding to the grayscale 255 according to the external compensation lookup table. The disclosure combines the external compensation method to improve the display effect of the PWM digital drive and avoids the problem that the PWM circuit cannot eliminate the unevenness of the display panel in the grayscale 255 and enhance the actual display effect of the display panel.

Figure 5:
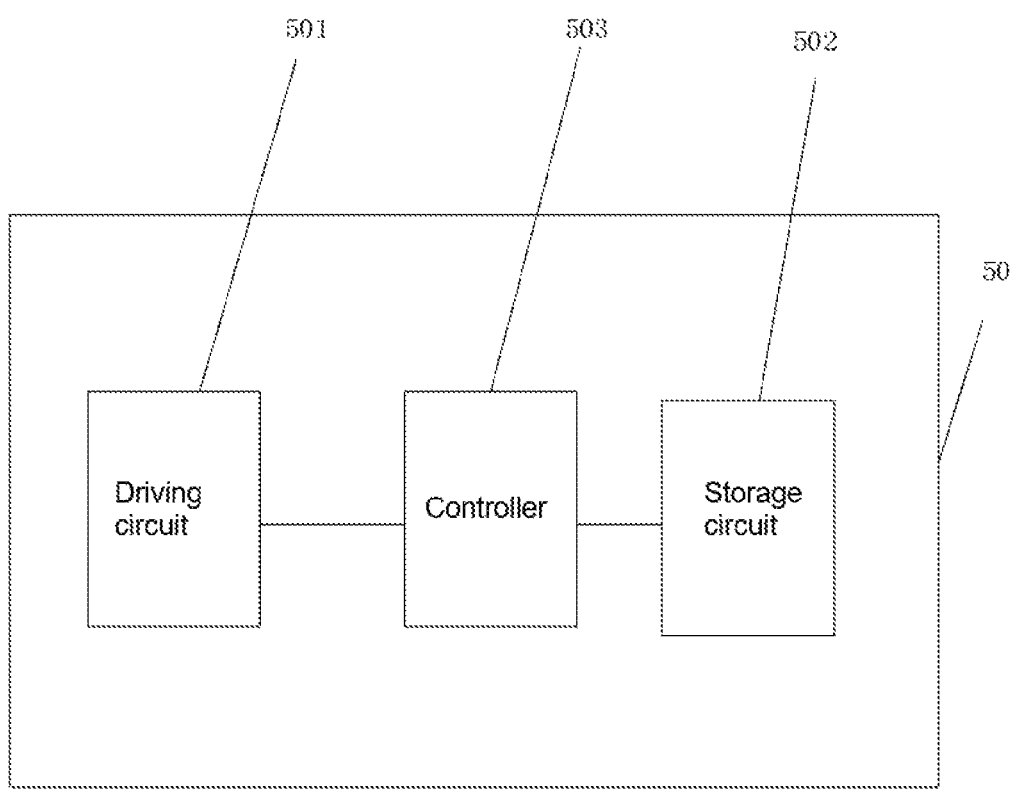
FIG. 5 is a schematic structural diagram of an embodiment of the display panel according to the present disclosure.

The present disclosure also provides a liquid crystal display panel, and specifically, as shown in FIG. 5. The display panel 50 includes a PWM driving circuit 501 and a storage circuit 502, and a controller 503, which are electrically connected to the PWM driving circuit 501 and the storage circuit 502, respectively. The storage circuit 502 is used to storage a preset voltage table corresponding to a different grayscale of the PWM driving circuit 501.

The controller 503 is used to pre-acquire an external compensation lookup table corresponding to each pixel grayscale 255 in the display panel 50; introduce the external compensation lookup table into the storage circuit 502 and replace the data corresponding to the original grayscale 255 in the preset voltage table; and further used to acquire a corresponding voltage from the external compensation lookup table and control the PWM driving circuit 501 outputting the corresponding driving voltage, when the pixel value is grayscale 255.

The display panel can realize the above-described method of improving the display effect of the display panel, specifically referring to FIG. 4 and its related description, and will not be described again.

In the above embodiment, the external compensation lookup table when the pixel sub-pixel is grayscale 255 is determined by the panel type. The R/G/B sub-pixels of the RGB panel correspond to three external compensation lookup tables. The R/G/B/W sub-pixels of the RGBW panel correspond to four external compensation lookup tables. In the method for improving the display panel display effect of the present disclosure, the driving method of the driving circuit is not limited to the sub-field cutting method, and various driving methods are applied to the PWM.

The foregoing is merely an embodiment of the present disclosure and is not intended to limit the scope of the disclosure. Any equivalent structural or equivalent process transformation using the present specification and the accompanying drawings, either directly or indirectly, in other related technical fields, are likewise included within the scope of the patent protection of the present disclosure.

What is claimed is:

1. A method for improving display effect of a display panel, the display panel comprising a PWM (Pulse Width Modulation) driving circuit and a memory chip, the memory chip storing a preset voltage table corresponding to a different grayscale of the PWM driving circuit, wherein the method comprises:
   driving the PWM driving circuit according to the preset voltage table;
   acquiring a corresponding voltage at a grayscale 255 from the preset voltage table stored by the memory chip;
   external compensating a display image of the grayscale 255 to respectively acquire an external compensation lookup table of the grayscale 255 in different sub-pixels;
   introducing the external compensation lookup table to the memory chip and replacing a data corresponding to an original grayscale 255 in the preset voltage table;
   acquiring a corresponding voltage from the external compensation lookup table and controlling a corresponding driving voltage outputted from the PWM driving circuit, when a pixel value is grayscale 255.

2. The method for improving display effect of a display panel according to claim 1, wherein the external compensation lookup table comprises a bright state voltage value corresponding to the grayscale 255.

3. The method for improving display effect of a display panel according to claim 1, wherein a dark state voltage value in the preset voltage table is the voltage value corresponding to a grayscale 0.

4. The method for improving display effect of a display panel according to claim 1, wherein after the step of introducing the external compensation lookup table to the memory chip and replacing a data corresponding to an original grayscale 255 in the preset voltage table, further comprises:
   acquiring a corresponding voltage from the preset voltage table according to the acquired pixel value, when the pixel value is grayscale 0 to 254;
   controlling the corresponding driving voltage outputted from the PWM driving circuit.

5. The method for improving display effect of a display panel according to claim 1, wherein the display panel is an OLED display panel.

6. The method for improving display effect of a display panel according to claim 1, wherein the pixel comprises RGB sub-pixel.

7. The method for improving display effect of a display panel according to claim 1, wherein the pixel comprises RGBW sub-pixel.

8. A method for improving display effect of a display panel, the display panel comprising a PWM (Pulse Width Modulation) driving circuit and a memory chip, the memory chip storing a preset voltage table corresponding to a different grayscale of the PWM driving circuit, wherein the method comprises:
   pre-acquiring an external compensation lookup table corresponding to the grayscale 255 of each pixel in the display panel;
   introducing the external compensation lookup table to the memory chip and replacing a data corresponding to an original grayscale 255 in the preset voltage table;
   driving the PWM driving circuit according to the replaced data.

9. The method for improving display effect of a display panel according to claim 8, wherein the external compensation lookup table comprises a bright state voltage value corresponding to the grayscale 255.

10. The method for improving display effect of a display panel according to claim 8, wherein the dark state voltage value in the preset voltage table is the voltage value corresponding to the grayscale 0.

11. The method for improving display effect of a display panel according to claim 8, wherein the step of pre-acquiring an external compensation lookup table corresponding to each pixel grayscale 255 in the display panel, specifically comprising:
   driving the PWM driving circuit according to the preset voltage table;
   acquiring a corresponding voltage at the grayscale 255 from the preset voltage table stored in the storage;

external compensating a display image of the grayscale 255 to respectively acquire the external compensation lookup table of the grayscale 255 in different sub-pixels.

12. The method for improving display effect of a display panel according to claim 8, wherein the step of driving the PWM driving circuit according to the replaced data, further comprises:

acquiring the corresponding voltage from the preset voltage table according to acquired pixel value and controlling the PWM driving circuit outputting the corresponding driving voltage, when the pixel value is grayscale 0 to 254.

13. The method for improving display effect of a display panel according to claim 8, wherein the step of driving the PWM driving circuit according to the replaced data, specifically comprising:

acquiring the corresponding voltage from the external compensation lookup table and controlling the PWM driving circuit outputting the corresponding driving voltage, when the pixel value is grayscale 255.

14. The method for improving display effect of a display panel according to claim 8, wherein the display panel is an OLED display panel.

15. The method for improving display effect of a display panel according to claim 8, wherein the pixel comprises RGB sub-pixel.

16. The method for improving display effect of a display panel according to claim 8, wherein the pixel comprises RGBW sub-pixel.

17. A display panel, wherein the display panel comprises a PWM (Pulse Width Modulation) driving circuit and a storage circuit and a controller, the controller is electrically connected to the PWM driving circuit and the storage circuit, respectively, the storage circuit is used to storage a preset voltage table corresponding to a different grayscale of the PWM driving circuit, the controller is used to pre-acquire an external compensation lookup table corresponding to each pixel grayscale 255 in the display panel; introduce the external compensation lookup table into the storage circuit and replace the data corresponding to the original grayscale 255 in the preset voltage table; and further used to acquire a corresponding voltage from the external compensation lookup table and control the PWM driving circuit outputting the corresponding driving voltage, when the pixel value is grayscale 255.

18. The display panel according to claim 17, wherein the display panel is an OLED display panel.

19. The display panel according to claim 17, wherein the pixel comprises RGB sub-pixel.

20. The display panel according to claim 17, wherein the pixel comprises RGBW sub-pixel.

* * * * *